(12) United States Patent
Yukinari et al.

(10) Patent No.: US 6,466,073 B1
(45) Date of Patent: Oct. 15, 2002

(54) METHOD AND CIRCUITRY FOR GENERATING CLOCK

(75) Inventors: Yoshio Yukinari; Kouichi Ishimi, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 50 days.

(21) Appl. No.: 09/670,584

(22) Filed: Sep. 27, 2000

(30) Foreign Application Priority Data

Apr. 12, 2000 (JP) .......................................... 2000-111121

(51) Int. Cl.$^7$ ................................................. G06F 1/08
(52) U.S. Cl. ......................... 327/291; 327/407; 327/115
(58) Field of Search ................................. 327/113, 115, 327/114, 117, 291, 407

(56) References Cited

U.S. PATENT DOCUMENTS

| | | | |
|---|---|---|---|
| 4,893,271 A | 1/1990 | Davis et al. ................. | 364/900 |
| 6,070,248 A | * 5/2000 | Yu et al. ...................... | 327/291 |
| 6,148,225 A | * 11/2000 | Krestler et al. .............. | 600/411 |
| 6,282,210 B1 | * 8/2001 | Rapport et al. ............. | 370/518 |

FOREIGN PATENT DOCUMENTS

| | | |
|---|---|---|
| JP | 54-146926 | 11/1979 |
| JP | 57-34245 | 2/1982 |
| JP | 4-12842 | 3/1992 |

OTHER PUBLICATIONS

U.S. Application No. 09/476,127, filed Jan. 3, 2000.

* cited by examiner

*Primary Examiner*—Dinh T. Le
(74) *Attorney, Agent, or Firm*—Burns, Doane, Swecker & Mathis, LLP

(57) ABSTRACT

Clock generating circuitry includes a frequency dividing circuit for dividing the frequency of an input clock by each of a plurality of predetermined frequency dividing ratios which differ from each other to generate a plurality of frequency-divided clocks such that a frequency-divided clock generated with the smallest frequency dividing ratio, i.e., a frequency-divided clock having the highest frequency, is slightly delayed against all of the other generated frequency-divided clocks. When changing the frequency of an output clock, a multiplexer switches from a previously selected one of the plurality of generated frequency-divided clocks to a desired clock in responsive to a control signal. The desired frequency-divided clock is then furnished as the output clock. Even when the plurality of frequency-divided clocks are not in phase with each other because of unit-to-unit variation when manufacturing the frequency dividing circuit, or due to changes in the operating conditions such as ambient temperature and voltages, the first clock pulse generated when the multiplexer performs the switching operation cannot have a shorter pulse width than pulses of the frequency-divided clock having the highest frequency.

14 Claims, 9 Drawing Sheets

US 6,466,073 B1

METHOD AND CIRCUITRY FOR GENERATING CLOCK

BACKGROUND OF THE INVENTION

1. Field of the Invention

The present invention relates to a method and circuitry for generating a clock. More particularly, it relates to a clock generating method and circuitry capable of switching between clock frequencies.

2. Description of the Prior Art

Phase locked loops or PLLs can generate a frequency-multiplied clock having either the same frequency as an input clock or a frequency that is an integral multiple of the frequency of the input clock, the frequency-multiplied clock being synchronized with the input clock. Recently-developed microprocessors operate on a high-speed clock such as a tens to hundreds of MHz clock and hence include a PLL as an indispensable component. On the other hand, recent years have seen progress made toward reducing power consumption in LSIs. Methods of reducing the clock frequency according to system operating conditions have been proposed as a technique for reducing power consumption.

Referring now to FIG. 7, there is illustrated a block diagram showing the structure of prior art clock generating circuitry capable of changing the frequency of its output. In the figure, reference numeral 1 denotes a PLL for generating a frequency-multiplied clock having either the same frequency as an input clock or a frequency that is an integral multiple of the frequency of the input clock, the frequency-multiplied clock being synchronized with the input clock, numeral 2 denotes a frequency dividing circuit for dividing the frequency of an output of the PLL 1 by a frequency dividing ratio corresponding to a frequency dividing ratio control signal applied thereto so as to generate a frequency-divided clock, numeral 3 denotes an output buffer for furnishing the frequency-divided clock from the frequency dividing circuit 2 as an external system clock, numeral 4 denotes a delay locked loop or DLL for delaying the frequency-divided clock generated by the frequency dividing circuit 2 by a fixed time interval corresponding to an output of a comparator 5 so as to generate an internal clock and adjust the phases of the external system clock and the internal clock, and numeral 6 denotes an internal circuit that operates on the internal clock. The comparator 5 compares the phase of a feedback clock from the internal circuit 6 and that of the external system clock and then furnishes a control signal to adjust the phases of the external system clock and the internal clock to the DLL 4.

In operation, the frequency dividing circuit 2 divides the frequency of the output of the PLL 1 by a frequency dividing ratio corresponding to the frequency dividing ratio control signal applied thereto so as to generate a frequency-divided clock. The clock generating circuitry can change the frequency of its output by controlling the frequency dividing ratio. The frequency dividing ratio control signal can be directly applied to the frequency dividing circuit 2 via an external terminal, or can be furnished to the frequency dividing circuit 2 by the internal circuit 6 controlled by the internal clock. As an alternative, the frequency dividing ratio control signal can be furnished by a circuit built on the same board, which operates on another clock that differs from the internal clock. The clock generating circuitry generates the internal clock supplied to the internal circuit 6 and the external system clock supplied to outside the chip from the frequency-divided clock from the frequency dividing circuit 2. The DLL 4 delays the frequency-divided clock by a fixed time interval corresponding to the control signal from the comparator 5 so as to generate the internal clock and also adjust the phase of the internal clock such that the internal clock is in phase with the external system clock.

Referring next to FIG. 8, there is illustrated a block diagram showing the structure of an example of the frequency dividing circuit 2 disposed in the prior art clock generating circuitry of FIG. 7. In the figure, reference numeral 21a denotes a 1/1th frequency divider 21a for dividing the frequency of the output of the PLL 1 by 1, numeral 21b denotes a 1/2th frequency divider for dividing the frequency of the output of the PLL 1 by 2, numeral 21c denotes a 1/4th frequency divider for dividing the frequency of the output of the PLL 1 by 4, numeral 21g denotes a 1/64th frequency divider for dividing the frequency of the output of the PLL 1 by 64, and numeral 21h denotes a 1/128th frequency divider for dividing the frequency of the output of the PLL 1 by 128. The frequency dividing circuit 2 further includes a 1/8th frequency divider, a 1/16th frequency divider, and a 1/32th frequency divider, which are not shown in the figure. In addition, reference numeral 22 denotes an edge trigger D-latch for furnishing a select signal to switch from a previously-selected one of a plurality of frequency-divided clocks generated by the plurality of frequency dividers 21a to 21h to a desired frequency-divided clock in response to the frequency dividing ratio control signal applied thereto from outside the frequency dividing circuit 2, and numeral 23 denotes a multiplexer for switching from a previously-selected one of the plurality of frequency-divided clocks of the plurality of frequency dividers 21a to 21h to a desired frequency-divided clock in response to the select signal from the edge trigger D-latch 22.

The frequency dividing circuit 2 can select one frequency-divided clock from the outputs of the 1/1th frequency divider 21a, the 1/2th frequency divider 21b, . . . , and the 1/128th frequency divider 21h, i.e., the 1/1th frequency-divided clock of the same frequency as the input clock, the 1/2th frequency-divided clock having a frequency that is a second submultiple of the frequency of the input clock, . . . , the 1/128th frequency-divided clock having a frequency that is a 128th submultiple of the frequency of the input clock, and then furnish the selected frequency-divided clock. In other words, the frequency dividing circuit 2 can freely switch from the 1/mth frequency-divided clock to the 1/nth frequency-divided clock, and vice versa, where m>n, and m=2, 4, . . . , 128 and n=1, 2, . . . , 64. In general, the plurality of frequency dividers 21a to 21h are so constructed that at the same time that the 1/128th frequency-divided clock from the 1/128th frequency divider 21h rises, all of the other frequency-divided clocks from the other frequency dividers 21a to 21g rise, and the edge trigger D-latch 22 furnishes the select signal that reflects a change in the frequency dividing ratio to the multiplexer 23 in response to a rising edge of the output of the 1/128th frequency divider 21h, so as to make the multiplexer 23 switch to a desired frequency-divided clock. The frequency dividing circuit 2 can thus change the frequency of its output smoothly without generation of spikes and glitches.

However, since the 1/1 to 1/128th frequency-divided clocks output from the plurality of frequency dividers 21a to 21h don's always reach the multiplexer 23 at the same time because of unit-to-unit variation when manufacturing the frequency dividing circuit 2, and changes in the operating conditions such as ambient temperature and voltages, an undesirable clock pulse can be generated as follows when the multiplexer 23 switches between the 1/1 through 1/128th frequency-divided clocks. Referring next to FIG. 9, there is illustrated a timing chart showing an undesirable operation of the frequency dividing circuit 2 when the multiplexer 23 switches from the 1/2th frequency-divided clock to the 1/1th frequency-divided clock. Assume that the 1/1 and 1/2th frequency-divided clocks reach the multiplexer 23 at the expiration of $T_{d1}$ and $T_{d2}$, respectively, after the output of the PLL 1 is applied to the frequency dividing circuit 2. When switching from the 1/2th frequency-divided clock to the 1/1th frequency-divided clock, the frequency dividing circuit 2 generates a first clock pulse from the rising edge of a 1/2th frequency-divided clock pulse and the falling edge of a 1/1th frequency-divided clock pulse. Therefore, if the 1/2th frequency-divided clock reaches the multiplexer 23 slightly behind the 1/1th frequency-divided clock, that is, if $T_{d1} < T_{d2}$, because of unit-to-unit variation when manufacturing the frequency dividing circuit 2, or another cause, the first clock pulse generated when the multiplexer 23 switches from the 1/2th frequency-divided clock to the 1/1th frequency-divided clock has a shorter pulse width than any 1/1th frequency-divided clock pulse by $(T_{d2}-T_{d1})$. Similarly, when the multiplexer 23 switches from the 1/nth (n=4, 8, 16, 32, 64, 128) frequency-divided clock to the 1/1th frequency-divided clock, the first clock pulse generated when the multiplexer 23 performs the switching operation has a shorter pulse width than any 1/1th frequency-divided clock pulse by $(T_{dn}-T_{d1})$ if $T_{d1} < T_{dn}$.

A problem with prior art clock generating circuitry is thus that the first clock pulse generated when performing a switching operation can have a shorter pulse width than a given pulse width, and, when switching to the highest frequency, the first clock pulse generated when performing the switching operation can have a shorter pulse width than any 1/1th frequency-divided clock pulse corresponding to the highest operating speed of the device and therefore the device falls in dire straits so that it can malfunction.

SUMMARY OF THE INVENTION

The present invention is proposed to solve the above problem. It is therefore an object of the present invention to provide a method and circuitry for generating a clock, capable of, even when switching to any clock frequency, making the first clock pulse generated when performing the switching operation have a longer pulse width than any 1/1th frequency-divided clock pulse corresponding to the highest operating speed of the device.

In accordance with one aspect of the present invention, there is provided a clock generating method comprising the steps of: dividing the frequency of an input clock by each of a plurality of predetermined frequency dividing ratios differ from each other so as to generate a plurality of frequency-divided clocks in such a manner that a frequency-divided clock generated with the smallest frequency dividing ratio, i.e., a frequency-divided clock having the highest frequency is delayed slightly against all of the other frequency-divided clocks generated; and, when changing the frequency of an output clock, switching from a previously selected one of the plurality of frequency-divided clocks generated to a desired one of them, and furnishing the desired frequency-divided clock as the output clock.

In accordance with a preferred embodiment of the present invention, the dividing step includes the step of generating the plurality of frequency-divided clocks in such a manner that the frequency-divided clock having the highest frequency is delayed slightly against all of the other frequency-divided clocks generated under all conditions. Preferably, the dividing step includes the step of generating the plurality of frequency-divided clocks in such a manner that all but the frequency-divided clock having the highest frequency are in phase with each other and only the frequency-divided clock having the highest frequency is delayed. In addition, the generating step can include the step of delaying only the frequency-divided clock having the highest frequency such that a difference between the instant when the frequency-divided clock having the highest frequency is generated and the instant when any other frequency-divided clock is generated is less than a pulse width of pulses of the frequency-divided clock having the highest frequency.

In accordance with another preferred embodiment of the present invention, the generating step is the step of generating the plurality of frequency-divided clocks in such a manner that they are sequentially generated and are therefore shifted from each other in time in order of decreasing frequency dividing ratio, i.e., increasing frequency. Preferably, the generating step includes the step of delaying each of the plurality of frequency-divided clocks by a time interval that increases with decrease in the frequency dividing ratio set to generate each of the plurality of frequency-divided clocks, i.e., increase in the frequency of each of the plurality of frequency-divided clocks. Furthermore, the delaying step can be the step of delaying the plurality of frequency-divided clocks such that a difference between the instant when a 1/mth frequency-divided clock having an mth submultiple of the frequency of the input clock is generated and the instant when a 1/nth frequency-divided clock having an nth submultiple of the frequency of the input clock is generated, where m and n are different integers, is less than an absolute value of a difference between a pulse width of pulses of the 1/mth frequency-divided clock and that of the 1/nth frequency-divided clock.

In accordance with another aspect of the present invention, there is provided clock generating circuitry comprising: a frequency dividing unit for dividing the frequency of an input clock by each of a plurality of predetermined frequency dividing ratios differ from each other so as to generate a plurality of frequency-divided clocks, and for furnishing the plurality of frequency-divided clocks in such a manner that a frequency-divided clock generated with the smallest frequency dividing ratio, i.e., a frequency-divided clock having the highest frequency is delayed slightly against all of the other frequency-divided clocks generated; and a switching unit, responsive to a control signal, for switching from a previously selected one of the plurality of frequency-divided clocks furnished from the frequency dividing unit to a desired one of them and for furnishing the desired frequency-divided clock so as to change the frequency of an output clock.

In accordance with a preferred embodiment of the present invention, the frequency dividing unit generates the plurality of frequency-divided clocks in such a manner that the frequency-divided clock having the highest frequency is delayed slightly against all of the other frequency-divided clocks generated under all conditions. Preferably, the frequency dividing unit generates the plurality of frequency-divided clocks in such a manner that all but the frequency-divided clock having the highest frequency are in phase with each other, and includes a delay unit for delaying only the frequency-divided clock having the highest frequency and furnishing the delayed frequency-divided clock to the switching unit. In addition, the delay unit can delay only the frequency-divided clock having the highest frequency such that a difference between the instant when the frequency-divided clock having the highest frequency is generated and the instant when any other frequency-divided clock is generated is less than a pulse width of pulses of the frequency-divided clock having the highest frequency.

In accordance with another preferred embodiment of the present invention, the frequency dividing unit generates and furnishes the plurality of frequency-divided clocks in such a manner that they are sequentially generated and are therefore shifted from each other in time in order of decreasing frequency dividing ratio, i.e., increasing frequency. Preferably, the frequency dividing unit includes a delay unit for delaying each of the plurality of frequency-divided clocks by a time interval that increases with decrease in the frequency dividing ratio set to generate each of the plurality of frequency-divided clocks, i.e., increase in the frequency of each of the plurality of frequency-divided clocks. Furthermore, the delaying unit can delay the plurality of frequency-divided clocks such that a difference between the instant when a 1/mth frequency-divided clock having an mth submultiple of the frequency of the input clock is furnished to the switching unit and the instant when a 1/nth frequency-divided clock having an nth submultiple of the frequency of the input clock is furnished to the switching unit, where m and n are different integers, is less than an absolute value of a difference between a pulse width of pulses of the 1/mth frequency-divided clock and that of the 1/nth frequency-divided clock.

Further objects and advantages of the present invention will be apparent from the following description of the preferred embodiments of the invention as illustrated in the accompanying drawings.

DETAILED DESCRIPTION OF THE PREFERRED EMBODIMENTS

Embodiment 1

Figure 1:
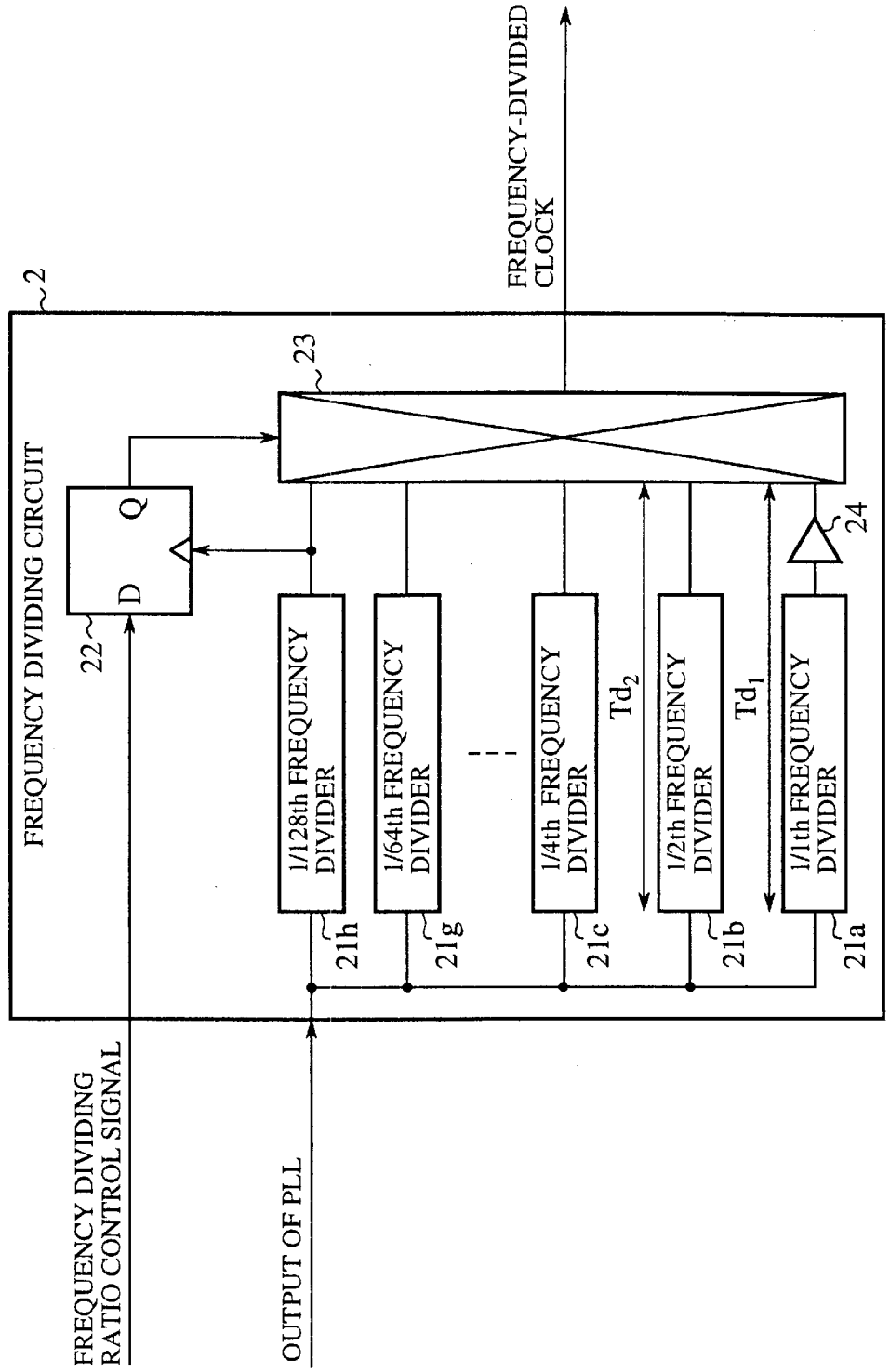
FIG. 1 is a block diagram showing the structure of a frequency dividing circuit disposed in clock generating circuitry capable of changing the frequency of its output in accordance with a first embodiment of the present invention.

Referring next to FIG. 1, there is illustrated a block diagram showing the structure of a frequency dividing circuit disposed in clock generating circuitry capable of changing the frequency of its output in accordance with a first embodiment of the present invention, the circuitry implementing a clock generating method according to the first embodiment. In the figure, reference numeral 21a denotes a 1/1 divide 21a for dividing the frequency of an output of a PLL (not shown) by 1, numeral 21b denotes a 1/2th frequency divider for dividing the frequency of the output of the PLL by 2, numeral 21c denotes a 1/4th frequency divider for dividing the frequency of the output of the PLL by 4, numeral 21g denotes a 1/64th frequency divider for dividing the frequency of the output of the PLL by 64, and numeral 21h denotes a 1/128th frequency divider for dividing the frequency of the output of the PLL by 128. The frequency dividing circuit 2 further includes a 1/8th frequency divider, a 1/16th frequency divider, and a 1/32th frequency divider, which are not shown in the figure. In addition, reference numeral 22 denotes an edge trigger D-latch for furnishing a select signal to switch from a previously-selected one of a plurality of frequency-divided clocks generated by the plurality of frequency dividers 21a to 21h to a desired frequency-divided clock in response to a frequency dividing ratio control signal applied thereto from outside the frequency dividing circuit 2, numeral 23 denotes a multiplexer for switching from a previously-selected one of the plurality of frequency-divided clocks output from the plurality of frequency dividers 21a to 21h to a desired frequency-divided clock in response to the select signal from the edge trigger D-latch 22, and for furnishing the desired frequency-divided clock, and numeral 24 denotes a delay element for delaying the frequency-divided clock output from the 1/1th frequency divider 21a by a predetermined time interval.

The plurality of frequency dividers 21a to 21h disposed in the frequency dividing circuit 2 are so constructed that each of them generates a frequency-divided clock at the expiration of the same time interval after receiving the output of the PLL, that is, they generate frequency-divided clocks in phase with each other. In other words, at the same time that each frequency-divided clock pulse output from the 1/128th frequency divider 21h rises, all other first frequency-divided clock pulses output from the other frequency dividers 21a to 21g rise. On the other hand, the delay element 24 connected to the 1/1th frequency divider 21a is so constructed as to delay the 1/1th frequency-divided clock output from the 1/1th frequency divider 21a by the predetermined time interval so that the 1/1th frequency-divided clock from the 1/1th frequency divider 21a reaches the multiplexer 23 slightly behind all of the other frequency-divided clocks, even when the frequency dividing circuit 2 is under all conditions, e.g., even when the plurality of frequency-divided clocks output from the plurality of frequency dividers 21a to 21h are not in phase with each other because of unit-to-unit variation when manufacturing the frequency dividing circuit 2, and changes in the operating conditions such as ambient temperature and voltages.

Figure 7:
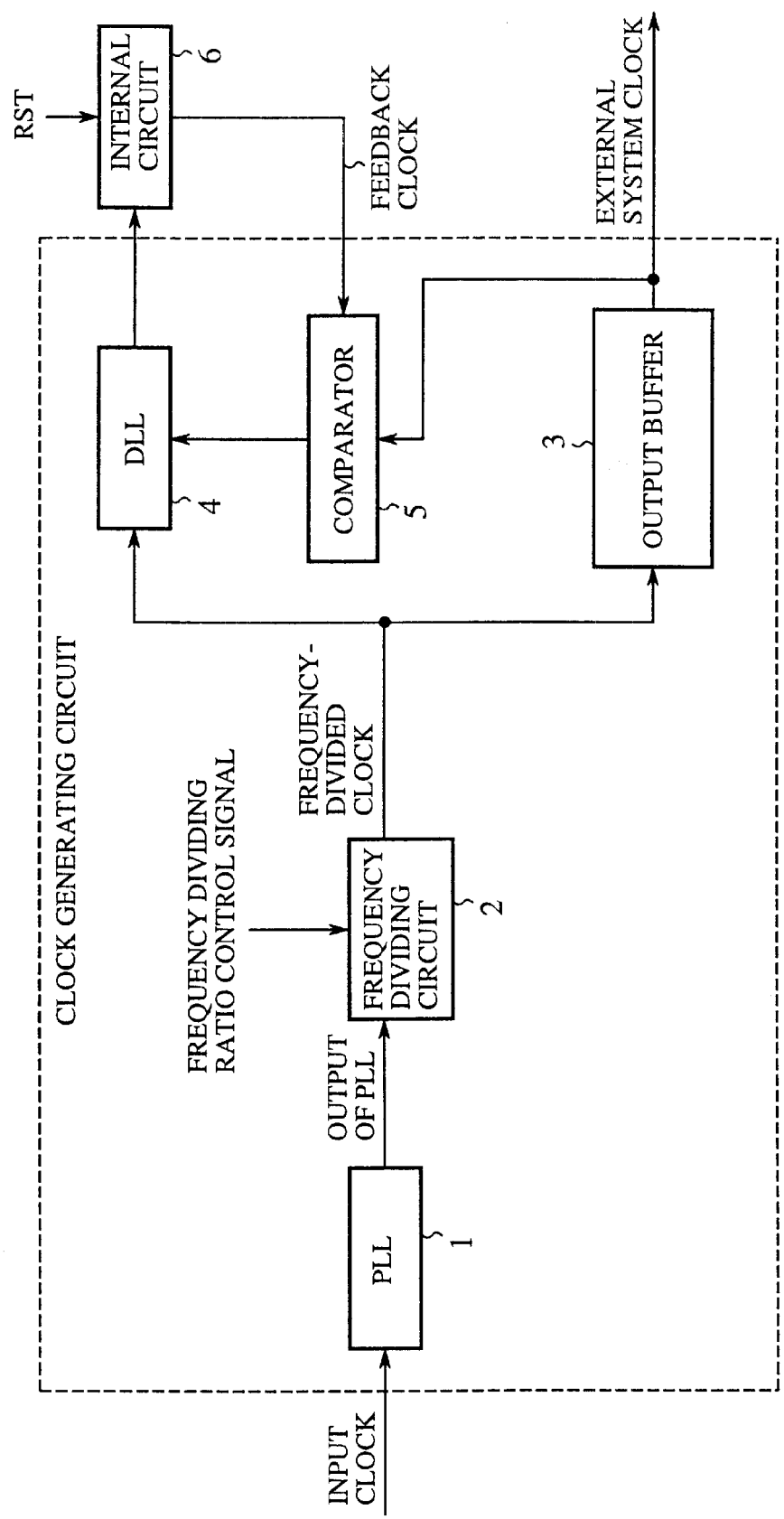
FIG. 7 is a block diagram showing the structure of an example of prior art clock generating circuitry capable of changing the frequency of its output.
Figure 8:
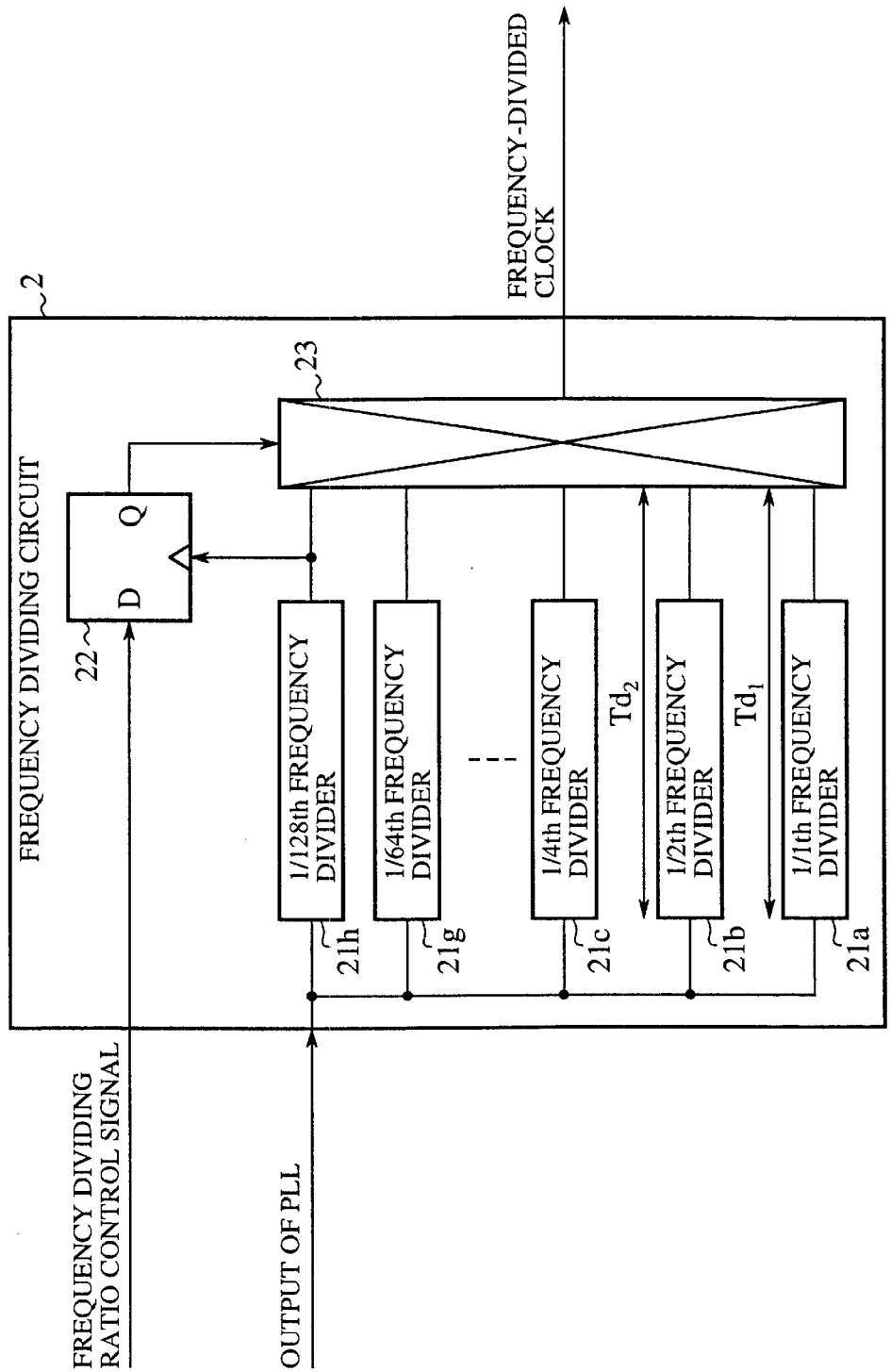
FIG. 8 is a block diagram showing the structure of an example of a frequency dividing circuit disposed in the prior art clock generating circuitry of FIG. 7.
Figure 9:
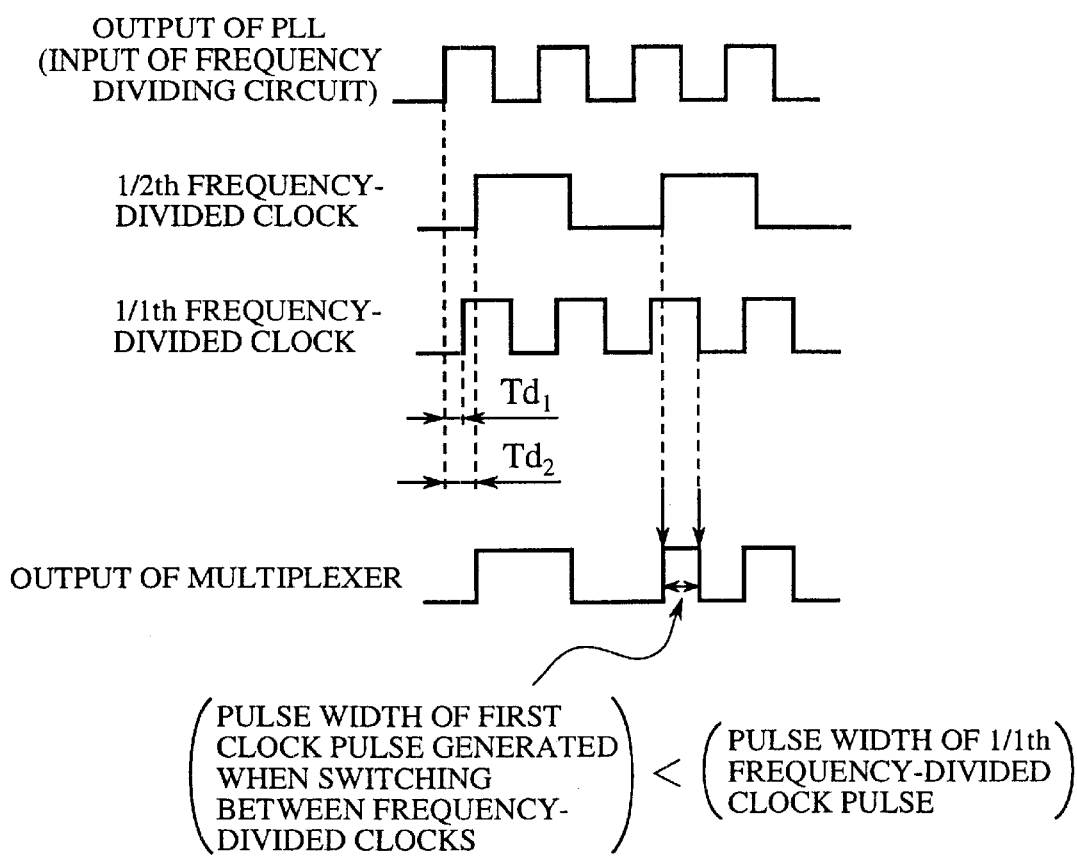
FIG. 9 is a timing chart showing an example of the operation of the frequency dividing circuit of FIG. 8.

The clock generating circuitry capable of changing the frequency of its output in accordance to the first embodiment has the same structure as shown in FIG. 7, and therefore the description of the structure will be omitted hereinafter.

In operation, each of the plurality of frequency dividers 21a to 21h disposed in the frequency dividing circuit 2 generates a frequency-divided clock at the expiration of the same time interval after receiving the output of the PLL. In other words, the plurality of frequency dividers 21a to 21h generates the 1/1th frequency-divided clock of the same frequency as the input clock, the 1/2th frequency-divided clock having a frequency that is a second submultiple of the frequency of the input clock, . . . , the 1/128th frequency-divided clock having a frequency that is a 128th submultiple of the frequency of the input clock in such a manner that at the same time that each frequency-divided clock pulse output from the 1/128th frequency divider 21h rises, all other first frequency-divided clock pulses output from the other frequency dividers 21a to 21g rise. When changing the frequency of the output clock, the frequency dividing circuit 2 can switch from a previously-selected one of the 1/1th frequency-divided clock, the 1/2th frequency-divided clock, . . . , and the 1/128th frequency-divided clock to a desired frequency-divided clock in response to the frequency dividing ratio control signal applied thereto. The edge trigger D-latch 22 furnishes the frequency dividing ratio control signal applied to its D terminal by way of its Q terminal, as the select signal, to the multiplexer 23, in response to the rising edges of the output of the 1/128th frequency divider 21h. As a result, the frequency dividing circuit 2 can switch to the desired frequency-divided clock smoothly without generation of spikes and glitches.

Figure 2:
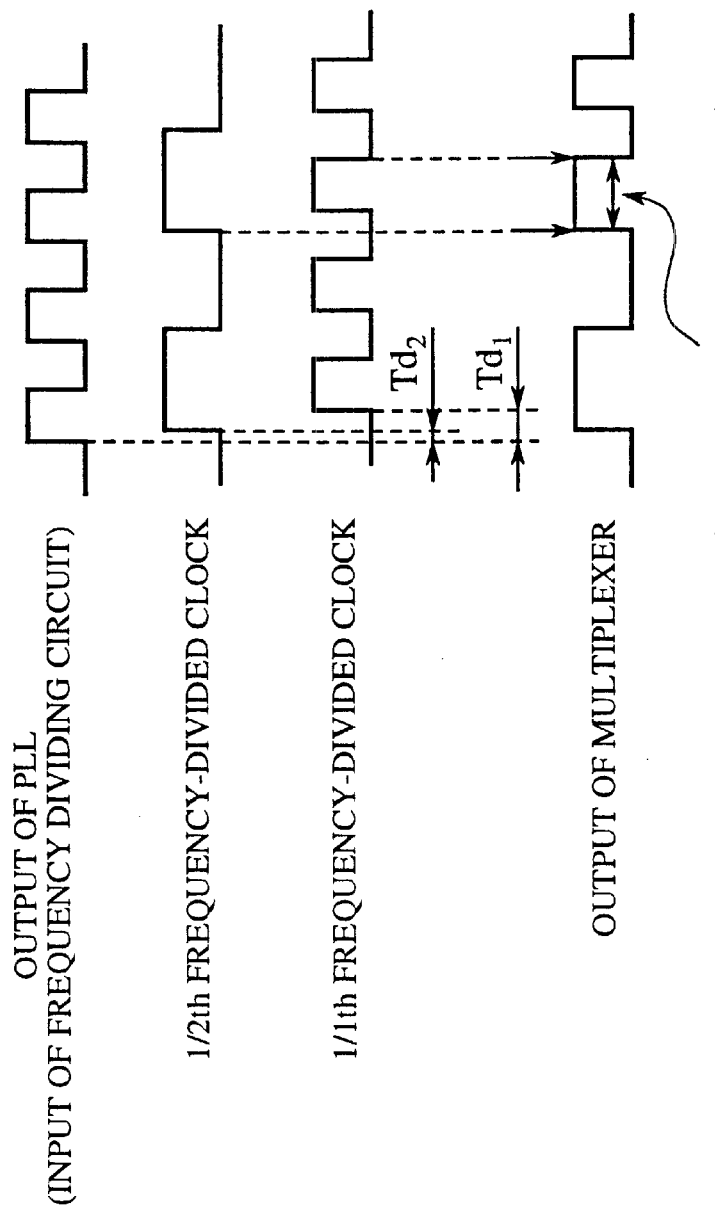
FIG. 2 is a timing chart showing an example of the operation of the frequency dividing circuit in accordance with the first embodiment of the present invention.

Referring next to FIG. 2, there is illustrated a timing chart showing an example of the operation of the frequency dividing circuit 2 according to the first embodiment. Assume that the 1/1 and 1/2th frequency-divided clocks reach the multiplexer 23 at the expiration of $T_{d1}$ and $T_{d2}$, respectively, after the output of the PLL is applied to the frequency dividing circuit 2. When switching from the 1/2th frequency-divided clock to the 1/1th frequency-divided clock, the frequency dividing circuit 2 generates a first clock pulse from the rising edge of a 1/2th frequency-divided clock pulse and the falling edge of a 1/1th frequency-divided clock pulse. As previously mentioned, since the 1/1th frequency-divided clock from the 1/1th frequency divider 21a reaches the multiplexer 23 slightly behind any other frequency-divided clock, that is, $T_{d1}>T_{d2}$, the first clock pulse generated when the multiplexer 23 switches from the 1/2th frequency-divided clock to the 1/1th frequency-divided clock has a longer pulse width than any 1/1th frequency-divided clock pulse by $(T_{d1}-T_{d2})$. Accordingly, the first clock pulse generated when the multiplexer 23 switches from the 1/2th frequency-divided clock to the 1/1th frequency-divided clock cannot have a shorter pulse width than any 1/1th frequency-divided clock pulse.

Similarly, when the multiplexer 23 switches from the 1/mth (m=4, 8, 16, 32, 64, 128) frequency-divided clock to the 1/1th frequency-divided clock, the first clock pulse generated when the multiplexer 23 performs the switching operation has a longer pulse width than any 1/1th frequency-divided clock pulse by $(T_{d1}-T_{d2})$, where $T_{dm}$ is the length of time that elapses until the 1/mth frequency-divided clock reaches the multiplexer 23 after the output of the PLL is applied to the frequency dividing circuit 2 and is substantially equal to $T_{d2}$ because all but the 1/1th frequency-divided clock are in phase with each other when they reach the multiplexer.

Figure 3:
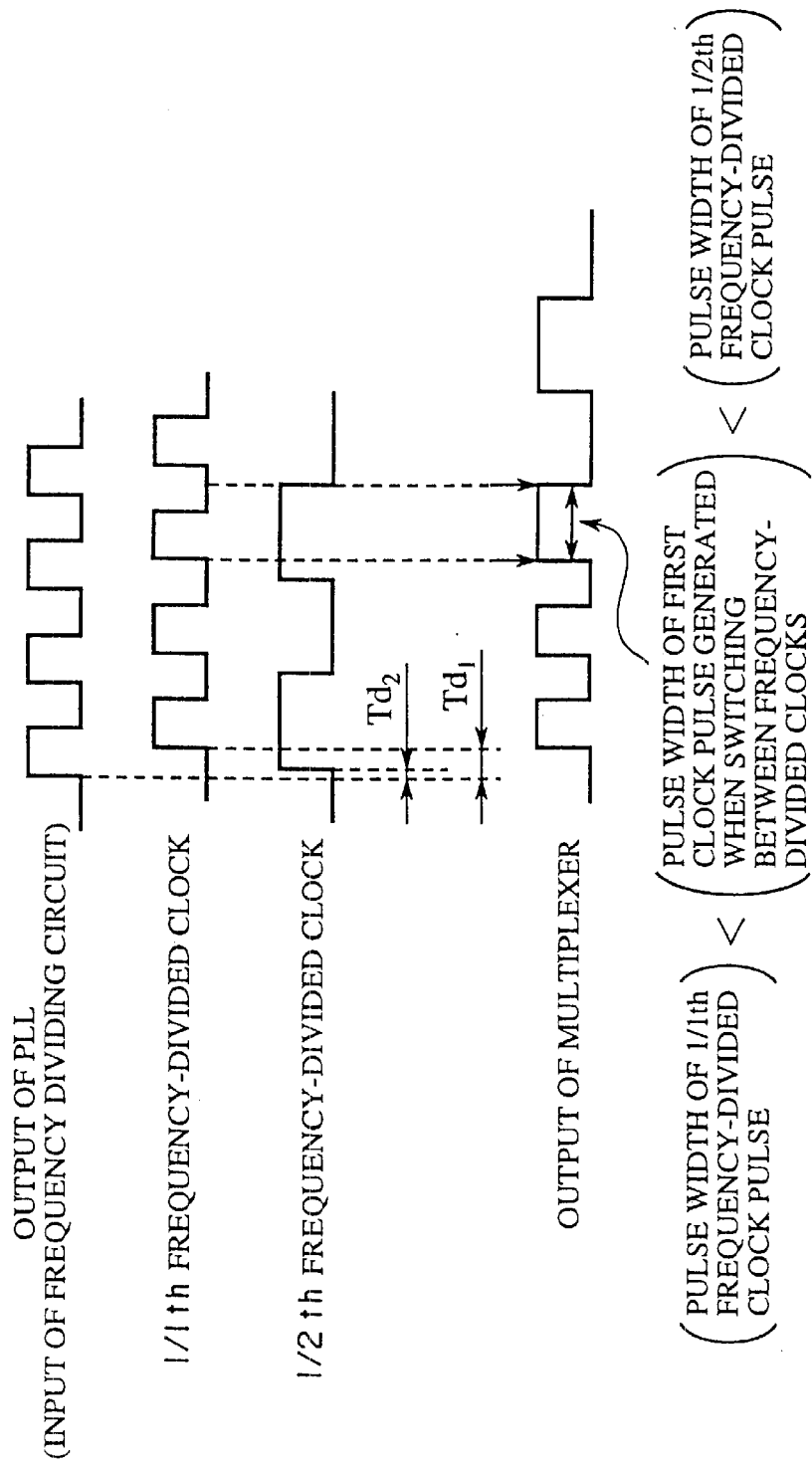
FIG. 3 is a timing chart showing another example of the operation of the frequency dividing circuit in accordance with the first embodiment of the present invention.

Referring next to FIG. 3, there is illustrated a timing chart showing a process of switching from the 1/1th frequency-divided clock to the 1/2th frequency-divided clock performed by the frequency dividing circuit 2. When switching from the 1/1th frequency-divided clock to the 1/2th frequency-divided clock, the frequency dividing circuit 2 generates a first clock pulse from the rising edge of a 1/1th frequency-divided clock pulse and the falling edge of a 1/2th frequency-divided clock pulse. As a result, the first clock pulse generated when the multiplexer 23 switches from the 1/1th frequency-divided clock to the 1/2th frequency-divided clock has a shorter pulse width than any 1/2th frequency-divided clock pulse by $(T_{d1}-T_{d2})$. In this case, in order to make the first clock pulse have a longer pulse width than any 1/1th frequency-divided clock pulse, $(T_{d1}-T_{d2})$ has to be less than the pulse width of any 1/1th frequency-divided clock pulse, as can be seen from FIG. 3. When the time delay provided by the delay element 24 is set so that this condition is satisfied, the first clock pulse generated when the multiplexer 23 switches from the 1/1th frequency-divided clock to the 1/2th frequency-divided clock cannot have a shorter pulse width than any 1/1th frequency-divided clock pulse.

Similarly, when the multiplexer 23 switches from the 1/1th frequency-divided clock to the 1/mth (m=4, 8, 16, 32, 64, 128) frequency-divided clock, the first clock pulse generated when the multiplexer 23 performs the switching operation has a shorter pulse width than any 1/mth frequency-divided clock pulse by $(T_{d1}-T_{dm})$. In this case, in order to make the first clock pulse have a longer pulse width than any 1/1th frequency-divided clock pulse, $(T_{d1}-T_{dm})$ has to be less than the pulse width of any 1/1th frequency-divided clock pulse, just as in the above-mentioned case. When $T_{d1}$ and $T_{dm}$ are set such that the above condition is satisfied, the first clock pulse generated when the multiplexer 23 switches from the 1/1th frequency-divided clock to the 1/mth frequency-divided clock cannot have a shorter pulse width than any 1/1th frequency-divided clock pulse. $T_{dm}$ is substantially equal to $T_{d2}$ as long as the timing with which the plurality of frequency-divided clocks are generated dont's vary greatly because of unit-to-unit variation when manufacturing the frequency dividing circuit 2, and changes in the operating conditions such as ambient temperature and voltages. Accordingly, as long as the time delay provided by the delay element 24 is set so that $(T_{d1}-T_{d2})$ is less than the pulse width of any 1/1th frequency-divided clock pulse, the first clock pulse generated when the multiplexer 23 switches from the 1/1th frequency-divided clock to the 1/mth frequency-divided clock cannot have a shorter pulse width than any 1/1th frequency-divided clock pulse.

As previously mentioned, in accordance with the first embodiment of the present invention, the delay element 24 delays only the 1/1th frequency-divided clock output from the 1/1th frequency divider 21a by a fixed time interval so that the 1/1th frequency-divided clock reaches the multiplexer 23 slightly behind all of the other frequency-divided clocks, even when all of the plurality of frequency-divided clocks output from the plurality of frequency dividers 21a to 21h are not in phase with each other because of unit-to-unit variation when manufacturing the frequency dividing circuit 2, and changes in the operating conditions such as ambient temperature and voltages. As a result, the first clock pulse generated when switching between frequencies always satisfies the following relationship: (the pulse width of the 1/1th frequency-divided clock)<(the pulse width of the first clock pulse generated when switching between frequencies) <(the pulse width of the 1/128th frequency-divided clock). In other words, the clock generating circuitry according to the first embodiment does not generate any clock pulse having a pulse width less than that of the 1/1th frequency-divided clock. The first embodiment thus offers an advantage of being able to provide clock generating circuitry capable of changing the frequency of its output, which does not generate any clock pulse causing the device to malfunction.

Embodiment 2

Figure 4:
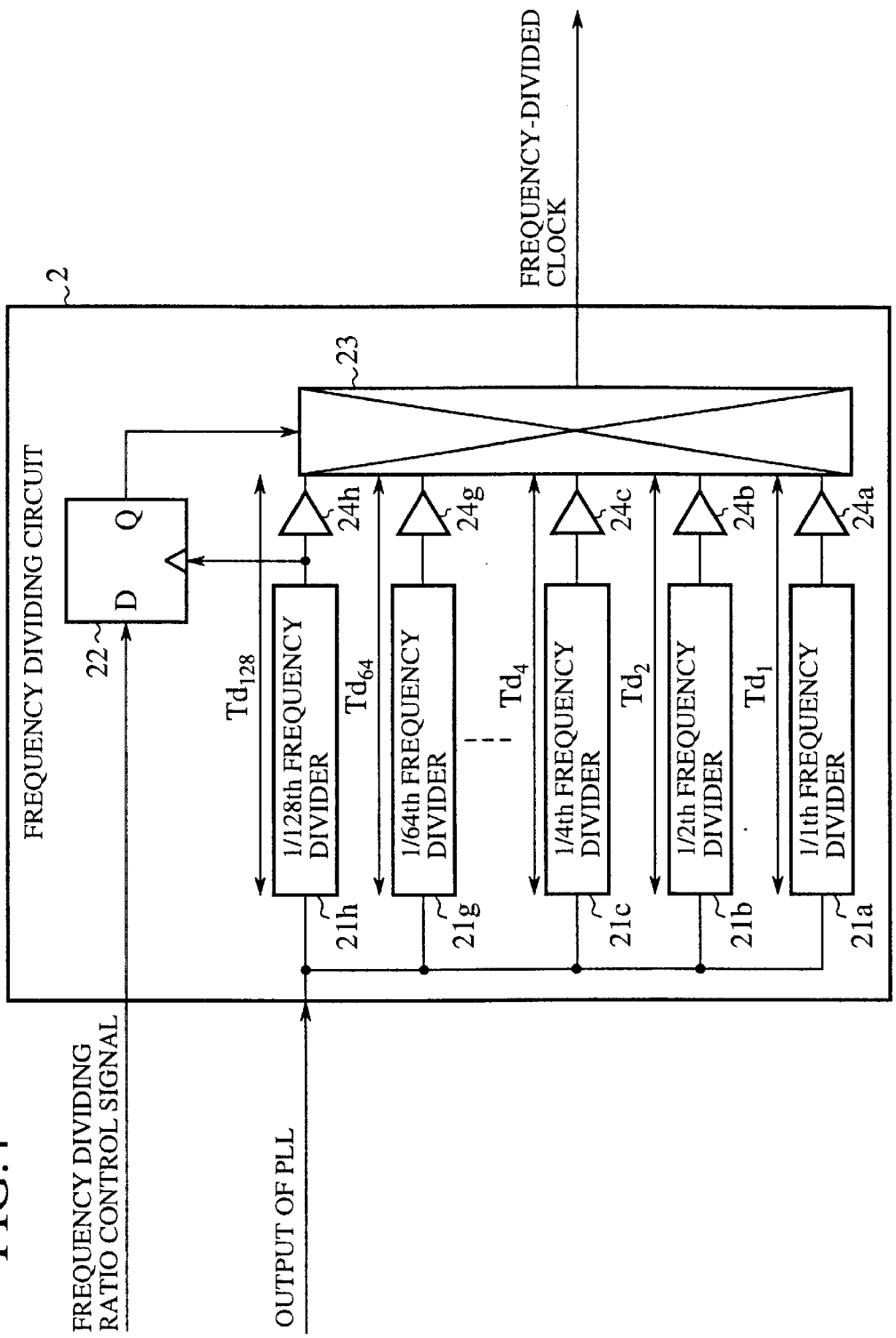
FIG. 4 is a block diagram showing the structure of a frequency dividing circuit disposed in clock generating circuitry capable of changing the frequency of its output in accordance with a second embodiment of the present invention.

Referring next to FIG. 4, there is illustrated a block diagram showing the structure of a frequency dividing circuit disposed in clock generating circuitry capable of changing the frequency of its output in accordance with a second embodiment of the present invention, the circuitry implementing a clock generating method according to the second embodiment. In the figure, the same components as of the frequency dividing circuit 2 of the above-mentioned first embodiment are designated by the same reference numerals as shown in FIG. 1, and therefore the description of those components will be omitted hereinafter. In FIG. 4, reference numerals 24a to 24h denote delay elements for delaying a plurality of frequency-divided clocks output from a plurality of frequency dividers: a 1/1th frequency divider 21a, a 1/2th frequency divider 21b, . . . , and a 1/128th frequency divider 21h, by predetermined different time intervals, respectively.

Like the above-mentioned first embodiment, the plurality of frequency dividers 21a to 21h disposed in the frequency dividing circuit 2 are so constructed that each of them generates a frequency-divided clock at the expiration of the same time interval after receiving the output of a PLL, that is, they generate frequency-divided clocks in phase with each other. In other words, at the same time that each frequency-divided clock pulse output from the 1/128th frequency divider 21h rises, all other frequency-divided clock pulses output from the other frequency dividers 21a to 21g rise. on the other hand, the plurality of delay elements 24a to 24h respectively connected to the 1/1th frequency divider 21a, the 1/2th frequency divider 21b, . . . , and the 1/128th frequency divider 21h are so constructed as to delay the plurality of frequency-divided clocks output from the plurality of frequency dividers by the predetermined different time intervals, respectively, so that the plurality of frequency-divided clocks output from the plurality of frequency dividers 21a to 21h sequentially reach a multiplexer 23 in order of the 1/128th frequency-divided clock, the 1/64th frequency-divided clock, . . . , and 1/1th frequency-divided clock, even when the plurality of frequency-divided clocks output from the plurality of frequency dividers 21a to 21h are not in phase with each other because of unit-to-unit variation when manufacturing the frequency dividing circuit 2, and changes in the operating conditions such as ambient temperature and voltages.

The respective time delays provided by the plurality of delay elements 24a to 24h are set such that the following relationship is satisfied: $T_{d1} > T_{d2} > \ldots > T_{d128}$, where $T_{d1}$, $T_{d2}$, . . . , and $Td_{d128}$ are the lengths of times that elapse, respectively, until the 1/1th frequency-divided clock, the 1/2th frequency-divided clock, . . . , and the 1/128th frequency-divided clock reach the multiplexer 23 after the output of the PLL is applied to the frequency dividing circuit 2, even when the frequency dividing circuit 2 is under all conditions, e.g., even when the plurality of frequency-divided clocks output from the plurality of frequency dividers 21a to 21h are not in phase with each other because of unit-to-unit variation when manufacturing the frequency dividing circuit 2, and changes in the operating conditions such as ambient temperature and voltages. Thus the frequency dividing circuit 2 according to the second embodiment is so constructed as to generate and delay the plurality of frequency-divided clocks using the plurality of delay elements 24a to 24h such that the plurality of frequency-divided clocks are furnished to the multiplexer 23 in turn in order of decreasing frequency dividing ratio, i.e., increasing frequency.

The clock generating circuitry capable of changing the frequency of its output in accordance to the second embodiment has the same structure as shown in FIG. 7, and therefore the description of the structure will be omitted hereinafter.

In operation, each of the plurality of frequency dividers 21a to 21h disposed in the frequency dividing circuit 2 generates a frequency-divided clock at the expiration of the same time interval after receiving the output of the PLL. In other words, the plurality of frequency dividers 21a to 21h generate the 1/1th frequency-divided clock of the same frequency as the input clock, the 1/2th frequency-divided clock having a frequency that is a second submultiple of the frequency of the input clock, . . . , the 1/128th frequency-divided clock having a frequency that is a 128th submultiple of the frequency of the input clock in such a manner that at the same time that each frequency-divided clock pulse output from the 1/128th frequency divider 21h rises, all other first frequency-divided clock pulses output from the other frequency dividers 21a to 21g rise. The 1/1th frequency-divided clock, the 1/2th frequency-divided clock, . . . , and the 1/128th frequency-divided clock output from the plurality of frequency dividers 21a to 21h are then delayed by the predetermined different time intervals by the plurality of delay elements 24a to 24h, respectively, and are furnished to the multiplexer 23. The plurality of frequency-divided clocks output from the plurality of frequency dividers 21a to 21h sequentially reach the multiplexer 23 in order of the 1/128th frequency-divided clock, the 1/64th frequency-divided clock, . . . , and 1/1th frequency-divided clock, so that they are shifted from each other in time when they enter the multiplexer 23. When changing the frequency of the output clock, the frequency dividing circuit 2 can switch from a previously-selected one of the 1/1th frequency-divided clock, the 1/2th frequency-divided clock, . . . , and the 1/128th frequency-divided clock to a desired frequency-divided clock in response to a frequency dividing ratio control signal applied thereto. An edge trigger D-latch 22 furnishes the frequency dividing ratio control signal applied to its D terminal by way of its Q terminal, as a select signal, to the multiplexer 23, in response to the rising edges of the output of the 1/128th frequency divider 21h. As a result, the frequency dividing circuit 2 can switch to the desired frequency-divided clock smoothly without generation of spikes and glitches.

Figure 5:
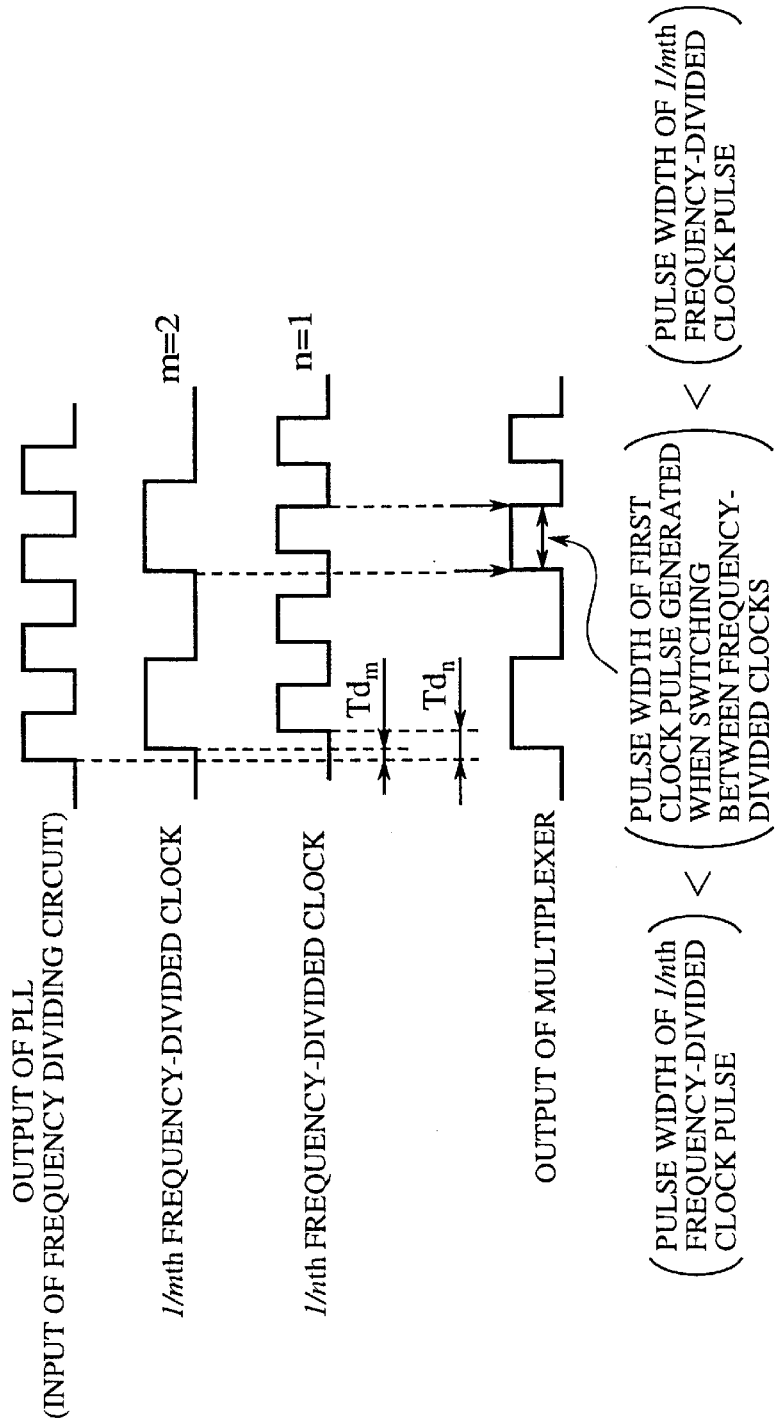
FIG. 5 is a timing chart showing an example of the operation of the frequency dividing circuit in accordance with the second embodiment of the present invention.

Referring next to FIG. 5, there is illustrated a timing chart showing an example of the operation of the frequency dividing circuit 2 according to the second embodiment. When switching from the 1/2th frequency-divided clock to the 1/1th frequency-divided clock, the frequency dividing circuit 2 generates a first clock pulse from the rising edge of a 1/2th frequency-divided clock pulse and the falling edge of a 1/1th frequency-divided clock pulse. As previously mentioned, since the 1/1th frequency-divided clock from the 1/1th frequency divider 21a reaches the multiplexer 23 behind any other frequency-divided clock, that is, $T_{d1} > T_{d2}$, the first clock pulse generated when the multiplexer 23 switches from the 1/2th frequency-divided clock to the 1/1th frequency-divided clock has a longer pulse width than any 1/1th frequency-divided clock pulse by $(T_{d1} - T_{d2})$. Accordingly, the first clock pulse generated when the multiplexer 23 switches from the 1/2th frequency-divided clock to the 1/1th frequency-divided clock cannot have a shorter pulse width than any 1/1th frequency-divided clock pulse.

Similarly, when the multiplexer 23 switches from the 1/mth frequency-divided clock to the 1/nth frequency-divided clock, where m>n, and m=2, 4, . . . , 128 and n=1, 2, ..., 64, the first clock pulse generated when the multiplexer 23 performs the switching operation has a longer pulse width than any 1/nth frequency-divided clock pulse by $(T_{d1}-T_{d2})$.

Figure 6:
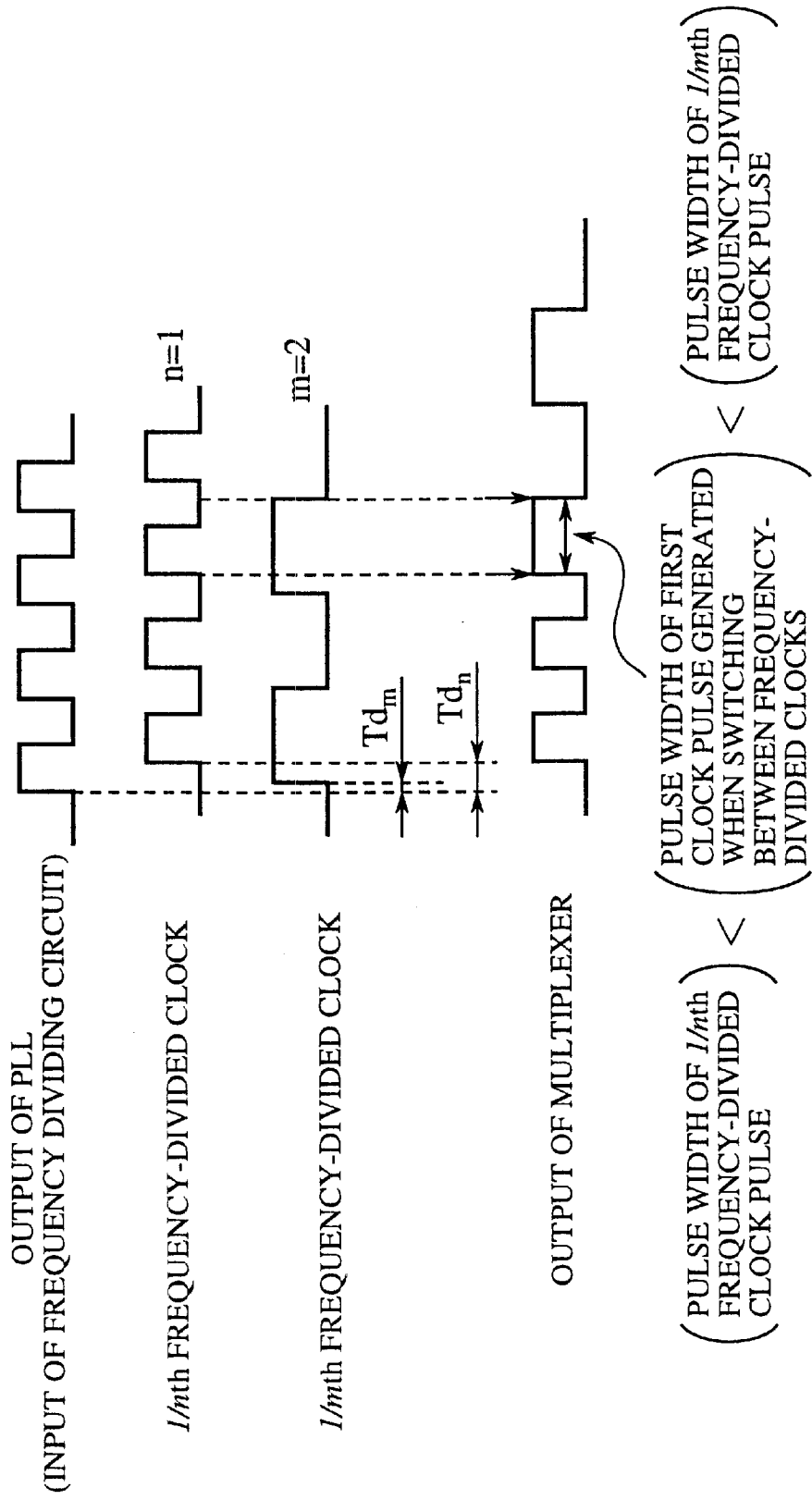
FIG. 6 is a timing chart showing another example of the operation of the frequency dividing circuit in accordance with the second embodiment of the present invention.

Referring next to FIG. 6, there is illustrated a timing chart showing a process of switching from the 1/1th frequency-divided clock to the 1/2th frequency-divided clock performed by the frequency dividing circuit 2. When switching from the 1/1th frequency-divided clock to the 1/2th frequency-divided clock, the frequency dividing circuit 2 generates a first clock pulse from the rising edge of a 1/1th frequency-divided clock pulse and the falling edge of a 1/2th frequency-divided clock pulse. As a result, the first clock pulse generated when the multiplexer 23 switches from the 1/1th frequency-divided clock to the 1/2th frequency-divided clock has a shorter pulse width than any 1/2th frequency-divided clock pulse by $(T_{d1}-T_{d2})$. In this case, in order to make the first clock pulse have a longer pulse width than any 1/1th frequency-divided clock pulse, $(T_{d1}-T_{d2})$ has to be less than the pulse width of any 1/1th frequency-divided clock pulse, as can be seen from FIG. 6. When the time delays provided by the two delay elements 24a and 24b are set so that this condition is satisfied, the first clock pulse generated when the multiplexer 23 switches from the 1/1th frequency-divided clock to the 1/2th frequency-divided clock cannot have a shorter pulse width than any 1/1th frequency-divided clock pulse.

Similarly, when the multiplexer 23 switches from the 1/nth frequency-divided clock to the 1/mth frequency-divided clock, where m>n, and m=2, 4, ..., 128 and n=1, 2, ..., 64, the first clock pulse generated when the multiplexer 23 performs the switching operation has a shorter pulse width than any 1/mth frequency-divided clock pulse by $(T_{dn}-T_{dm})$. In this case, in order to make the first clock pulse have a longer pulse width than any 1/nth frequency-divided clock pulse, $(T_{dn}-T_{dm})$ has to be less than the absolute value of the difference between the pulse widths of 1/nth and 1/mth frequency-divided clock pulses, just as in the above-mentioned case of FIG. 6. When $T_{d1}$ and $T_{dm}$ are set such that the above condition is satisfied, the first clock pulse generated when the multiplexer 23 switches from the 1/nth frequency-divided clock to the 1/mth frequency-divided clock cannot have a shorter pulse width than any 1/nth frequency-divided clock pulse.

As previously mentioned, in accordance with the second embodiment of the present invention, the predetermined different time delays provided by the plurality of delay elements 24a to 24h are set so that the plurality of frequency-divided clocks output from the plurality of frequency dividers 21a to 21h sequentially reach the multiplexer 23 in order of the 1/128th frequency-divided clock, the 1/64th frequency-divided clock, ..., and 1/1th frequency-divided clock, even when all of the plurality of frequency-divided clocks output from the plurality of frequency dividers 21a to 21h are not in phase with each other because of unit-to-unit variation when manufacturing the frequency dividing circuit 2, and changes in the operating conditions such as ambient temperature and voltages. As a result, when the multiplexer 23 switches from the 1/mth frequency-divided clock to the 1/nth frequency-divided clock, and vice versa, where m>n, and m=2, 4, ..., 128 and n=1, 2, ..., 64, the first clock pulse generated when the multiplexer 23 performs the switching operation always satisfies the following relationship: (the pulse width of the 1/nth frequency-divided clock)<(the pulse width of the first clock pulse generated when performing the switching operation)<(the pulse width of the 1/mth frequency-divided clock). In other words, the clock generating circuitry according to the second embodiment does not generate any clock pulse having a pulse width less than that of any 1/nth frequency-divided clock pulse. The second embodiment thus offers an advantage of being able to provide clock generating circuitry capable of changing the frequency of its output, for surely preventing any clock pulse causing the device to malfunction from being generated.

Many widely different embodiments of the present invention may be constructed without departing from the spirit and scope of the present invention. It should be understood that the present invention is not limited to the specific embodiments described in the specification, except as defined in the appended claims.

What is claimed is:

1. A clock generating method comprising the steps of:
   dividing the frequency of an input clock by each of a plurality of predetermined frequency dividing ratios which differ from each other to generate a plurality of frequency-divided clocks such that a frequency-divided clock generated with the smallest frequency dividing ratio is delayed slightly by a delay means against all of the other frequency-divided clocks generated; and
   when changing the frequency of an output clock, switching from a previously selected one of the plurality of frequency-divided clocks generated to a desired frequency-divided clock, and furnishing the desired frequency-divided clock as the output clock.

2. the clock generating method according to claim 1, wherein said dividing step includes the step of generating the plurality of frequency-divided clocks such that the frequency-divided clock having the highest frequency is delayed slightly against all of the other frequency-divided clocks generated regardless of operating or manufacturing generated conditions.

3. The clock generating method according to claim 2, wherein said dividing step includes the step of generating the plurality of frequency-divided clocks such that all but the frequency-divided clock having the highest frequency are in phase with each other and only the frequency-divided clock having the highest frequency is delayed.

4. The clock generating method according to claim 3, wherein said generating step includes the step of delaying only the frequency-divided clock having the highest frequency such that a difference between a) an instant when the frequency-divided clock having the highest frequency is generated and b) an instant when any other frequency-divided clock is generated, is less than a pulse width of pulses of the frequency-divided clock having the highest frequency.

5. The clock generating method according to claim 2, wherein said generating step is the step of generating the plurality of frequency-divided clocks such that they are sequentially generated and are shifted from each other in time in an order of increasing frequency.

6. The clock generating method according to claim 5, wherein said generating step includes the step of delaying each of the plurality of frequency-divided clocks by a time interval that increases with increase in the frequency of each of the plurality of frequency-divided clocks.

7. The clock generating method according to claim 6, wherein said delaying step is the step of delaying the plurality of frequency-divided clocks such that a difference between a) an instant when a 1/mth frequency-divided clock having an mth submultiple of the frequency of the input clock is generated and b) an instant when a 1/nth frequency-divided clock having an nth submultiple of the frequency of the input clock is generated, where m and n are different integers, is less than an absolute value of a difference between a pulse width of pulses of the 1/mth frequency-divided clock and that of the 1/nth frequency-divided clock.

8. Clock generating circuitry comprising:

a frequency dividing means for dividing the frequency of an input clock by each of a plurality of predetermined frequency dividing ratios which differ from each other to generate a plurality of frequency-divided clocks, and for furnishing the plurality of frequency-divided clocks such that a frequency-divided clock having the highest frequency is delayed slightly by a delay means against all of the other frequency-divided clocks generated; and a switching means, responsive to a control signal applied thereto, for switching from a previously selected one of the plurality of frequency-divided clocks furnished from said frequency dividing means to a desired frequency-divided clock and for furnishing the desired frequency-divided clock to change the frequency of an output clock.

9. The clock generating circuitry according to claim 8, wherein said frequency dividing means generates the plurality of frequency-divided clocks such that the frequency-divided clock having the highest frequency is delayed slightly against all of the other frequency-divided clocks generated regardless of operating or manufacturing generated conditions.

10. The clock generating circuitry according to claim 9, wherein said frequency dividing means generates the plurality of frequency-divided clocks such that all but the frequency-divided clock having the highest frequency are in phase with each other, and said delay means for delaying only the frequency-divided clock having the highest frequency and furnishing the delayed frequency-divided clock to said switching means.

11. The clock generating circuitry according to claim 10, wherein said delay means delays only the frequency-divided clock having the highest frequency such that a difference between a) an instant when the frequency-divided clock having the highest frequency is generated and b) an instant when any other frequency-divided clock is generated, is less than a pulse width of pulses of the frequency-divided clock having the highest frequency.

12. The clock generating circuitry according to claim 9, wherein said frequency dividing means generates and furnishes the plurality of frequency-divided clocks such that they are sequentially generated and are shifted from each other in time in an order of increasing frequency.

13. The clock generating circuitry according to claim 12, wherein said delay means for delaying each of the plurality of frequency-divided clocks by a time interval that increases with increase in the frequency of each of the plurality of frequency-divided clocks.

14. The clock generating circuitry according to claim 13, wherein said delay means delays the plurality of frequency-divided clocks such that a difference between a) an instant when a 1/mth frequency-divided clock having an mth submultiple of the frequency of the input clock is furnished to said switching means and b) an instant when a 1/nth frequency-divided clock having an nth submultiple of the frequency of the input clock is furnished to said switching means, where m and n are different integers, is less than an absolute value of a difference between a pulse width of pulses of the 1/mth frequency-divided clock and that of the 1/nth frequency-divided clock.

* * * * *